United States Patent [19]

Bullington et al.

[11] Patent Number: 5,453,347
[45] Date of Patent: Sep. 26, 1995

[54] METHOD FOR CONSTRUCTING FERROELECTRIC CAPACITORS ON INTEGRATED CIRCUIT SUBSTRATES

[75] Inventors: Jeff A. Bullington; Carl E. Montross, Jr.; Joseph T. Evans, Jr., all of Albuquerque, N.M.

[73] Assignee: Radiant Technologies, Albuquerque, N.M.

[21] Appl. No.: 255,066

[22] Filed: Jun. 7, 1994

Related U.S. Application Data

[62] Division of Ser. No. 970,937, Nov. 2, 1992, abandoned.

[51] Int. Cl.[6] ........................... G03F 7/26; H01L 21/00
[52] U.S. Cl. .................... 430/315; 430/311; 430/313; 430/329; 437/189; 437/228; 216/40; 216/48
[58] Field of Search ........................... 430/311, 313, 430/315, 318, 329; 437/189, 228, 229, 235; 156/634, 656, 664

[56] References Cited

U.S. PATENT DOCUMENTS

| | | | |
|---|---|---|---|
| 5,242,534 | 9/1993 | Bullington | 156/634 |
| 5,258,093 | 11/1993 | Manier | 156/626 |

Primary Examiner—Kathleen Duda
Attorney, Agent, or Firm—Calvin B. Ward

[57] ABSTRACT

A ferroelectric capacitor and method for making the same are disclosed. The ferroelectric capacitor may be constructed on a silicon substrate such as $SiO_2$ or $Si_3N_4$. The ferroelectric capacitor includes a bottom electrode, a layer of ferroelectric material, and a top electrode. The bottom electrode is constructed from a layer of platinum which is bonded to the silicon substrate by a layer of metallic oxide. The metallic oxide does not diffuse into the platinum; hence, a thinner layer of platinum may be utilized for the electrode. This reduces the vertical height of the capacitor and other problems associated with diffusion of the layer used to bond the bottom electrode to the substrate surface.

4 Claims, 1 Drawing Sheet

METHOD FOR CONSTRUCTING FERROELECTRIC CAPACITORS ON INTEGRATED CIRCUIT SUBSTRATES

This is a divisional of application Ser. No. 07/970,937 filed on Nov. 2, 1992 now abandoned.

FIELD OF THE INVENTION

The present invention relates to integrated circuits, and more particularly, to an improved method for constructing a ferroelectric capacitor on an integrated circuit substrate such as $SiO_2$.

BACKGROUND OF THE INVENTION

Capacitors with ferroelectric dielectrics provide much larger capacitances per unit area of surface than do capacitors generated with other materials. In addition, these structures may be used to store data by utilizing the remnant polarization in certain types of ferroelectric materials.

A ferroelectric capacitor is constructed by sandwiching a layer of ferroelectric material such as lead lanthanum zirconate titantate (PLZT) between two electrodes. To construct this type of structure on an integrated circuit substrate, a bottom electrode is deposited on the substrate. A layer of ferroelectric material is then deposited on the bottom electrode. In the case of PLZT materials, the PLZT material is then sintered at 650° C. to form the desired perovskite structure in the material. The top electrode is then deposited on the ferroelectric layer. The structure is then covered with an insulating layer such as $SiO_2$. Finally, connections are made to the bottom and top electrodes by opening via holes through the insulating layer.

Platinum is an excellent bottom electrode material to use with ferroelectric PZT and PLZT materials. First, platinum provides a low energy crystallization surface catalystizing the formation of perovskite structure. Second, platinum maintains its electrical properties at the crystallization temperatures routinely used for sintering ferroelectric materials. And, finally, ferroelectric materials, especially PZT and PLZT, are found experimentally to demonstrate excellent ferroelectric properties with platinum bottom electrodes.

There are, however, several major problems with platinum bottom electrodes when used in connection with integrated circuits. First, platinum does not adhere very well to silicon dioxide or silicon nitride during the high temperature sintering (650° C.) of ferroelectric materials. The high degree of stress on the platinum $SiO_2$ bond generated by the ferroelectric film as it crystallizes peels the bottom electrode off the substrate. Platinum is not used with pure silicon because the silicon diffuses into the platinum, and subsequently the PLZT film. The silicon contaminates the PLZT film in a manner that alters the properties of the resulting capacitor.

To avoid these problems, prior art systems use a layer of another material, referred to as a "glue" layer, to bond the platinum to the silicon dioxide or silicon nitride. The glue layer also prevents diffusion of the silicon into the platinum and PLZT layers. The preferred glue material is metallic titanium. This is the only material that is consistently successful at this role. The bottom electrode is typically deposited by first depositing a layer of titanium directly on a silicon dioxide or silicon nitride covered substrate and then depositing a layer of platinum on the metallic titanium.

While the titanium glue layer solves the problem of bonding the bottom electrode to the substrate, it introduces other problems when the platinum layer is to be used as a bottom electrode for a PLZT capacitor. The titanium glue layer diffuses into the platinum during the sintering stage of the ferroelectric film. The titanium in the platinum oxides as it diffuses into the platinum. This makes the bottom electrode into a sandwich of platinum layers with an insulating $TiO_2$ layer in between. Additionally, the titanium oxide occupies more space than either the platinum or titanium alone. This expands the volume of the bottom electrode and creates additional stress in the resulting capacitor. Finally, some of the titanium may reach the ferroelectric material and diffuse into the ferroelectric. In the case of PZT or PLZT, of which titanium is a major constituent, this can change the composition of the ferroelectric material near the surface of the bottom electrode, and hence, lead to changes in the ferroelectric properties.

In addition to altering the electrical properties of the capacitor, the diffused titanium makes it difficult to pattern the bottom electrode. Neither titanium dioxide, nor the titanium/platinum alloy formed in the platinum, are easily etched in the patterning steps. Even ion milling has difficulty etching these combinations. Consequently, as soon as the ferroelectric material has been sintered and the titanium has diffused into the platinum bottom electrode, the bottom electrode becomes unetchable for integrated circuit manufacturing purposes.

To avoid the problems resulting from titanium diffusing through the platinum to the ferroelectric layer, care must be taken to use just enough titanium in thickness to bond the bottom electrode to the substrate during sintering while using sufficient platinum to guarantee that any titanium that diffuses into the platinum will not reach the platinum/ferroelectric boundary. For example, it has been found experimentally that 1000A of titanium and 2500A of platinum provide sufficient bonding while note degrading the performance of the capacitor beyond acceptably limits.

Unfortunately, the thicker platinum layer required to alleviate the titanium diffusion problem interferes with the integrated circuit process. Platinum is very difficult to etch. Consequently, it has a tendency to undercut strongly. To compensate for this undercut, large etch biases must be used during fabrication. For example, to obtain 6 μ bottom electrode line using a 2500A thick platinum layer, one must start with 10 μ wide lines on the etch mask to compensate for up to 2 μ of overetch from both directions. To accommodate this initial line width, the devices being fabricated must be spaced further apart. The resulting spacing of devices makes it impossible to generate capacitors at densities consistent with the DRAM structures currently being fabricated. In addition, the etch step is difficult to control over large areas; thence poor uniformity and yield across the wafer result. To obtain satisfactory results, the platinum layer must be made 1000A or less in thickness. However, this thickness is insufficient to alleviate the titanium diffusion problems discussed above.

Another problem introduced by the thick platinum layer used in prior art devices relates to the artifacts introduced by the thickness of the bottom electrode. Consider an integrated circuit having a capacitor constructed thereon. Connections must be made between the circuit elements and the top and bottom electrodes of the capacitor. The interconnect lines must travel up the side of the capacitor. The height of the capacitor has a significant effect on metalization yield. The 3500A required by the prior art bottom electrode adds significantly to the capacitor height, and hence, significantly reduces device yields.

Broadly, it is the object of the present invention to provide an improved ferroelectric capacitor structure and method for constructing the same.

It is further object of the present invention to provide a ferroelectric capacitor structure in which the bottom electrode is significantly thinner than prior art bottom electrodes.

It is a still further object of the present invention to provide a ferroelectric capacitor structure having a reduced height relative to prior art ferroelectric capacitor structures.

These and other objects of the present invention will become apparent to those skilled in the art from the following detailed description of the invention and the accompanying drawings.

SUMMARY OF THE INVENTION

The present invention comprises an improved ferroelectric capacitor structure and a method for constructing the same on a silicon substrate. The ferroelectric capacitor includes a bottom electrode, a layer of ferroelectric material, and a top electrode. The bottom electrode is bonded to the silicon substrate by a layer of metallic oxide. The metallic oxide is preferably generated by depositing a layer of metallic titanium and then oxidizing the titanium.

DETAILED DESCRIPTION OF THE INVENTION

Figure 1:
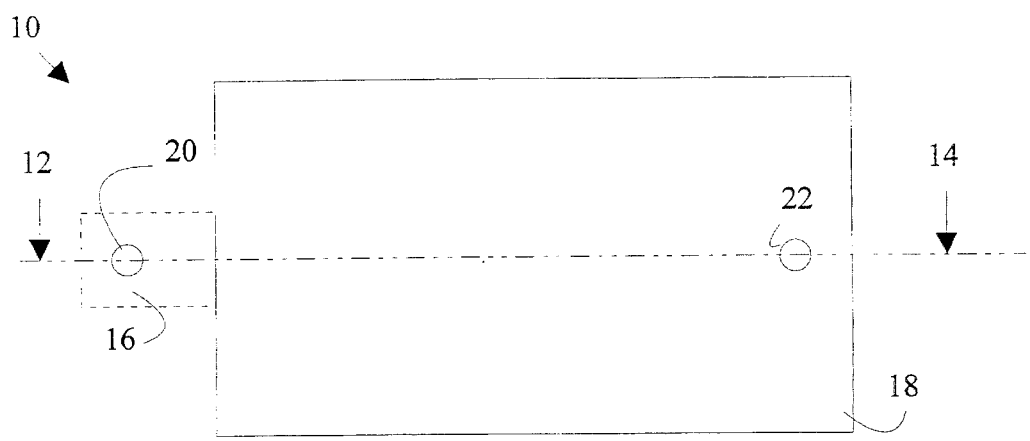
FIG. 1 is a top view of a ferroelectric capacitor according to the present invention.
Figure 2:
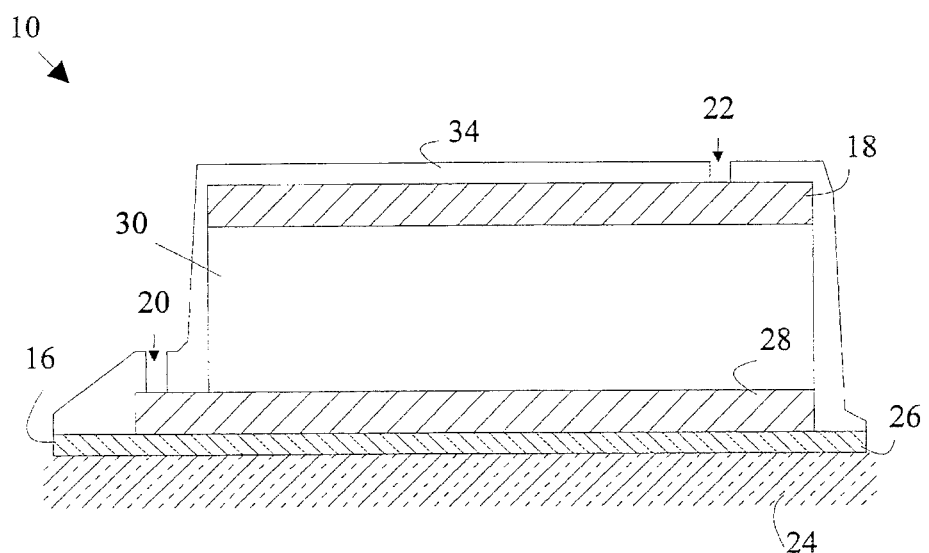
FIG. 2 is a cross-sectional view of ferroelectric capacitor 10 through lines 12–14.

The present invention achieves its advantages by replacing the titanium glue layer used in prior art ferroelectric capacitors with a $TiO_2$ glue layer. Since the $TiO_2$ layer does not diffuse into platinum, thinner glue layers may be utilized in constructing the bottom electrode. The manner in which a ferroelectric capacitor according to the present invention is constructed may be more easily understood with reference to FIGS. 1 and 2. FIG. 1 is a top view of a ferroelectric capacitor 10 according to the present invention. FIG. 2 is a cross-sectional view of ferroelectric capacitor 10 through lines 12–14.

Ferroelectric capacitor 10 is constructed from a ferroelectric layer 30 that is sandwiched between a bottom electrode 28 and a top electrode 18. Electrical connections are made to bottom electrode 28 through via hole 20 which provides access to an extension 16 of bottom electrode 28. Bottom electrode 28 is bounded to a $SiO_2$ substrate 24 by a glue layer 26 consisting of $TiO_2$.

Ferroelectric capacitor 10 is constructed by evaporating 150A of pure metallic titanium onto the $SiO_2$ substrate 24. The titanium layer is then annealed at 650° C. for 0.5 hours to fully oxidize the titanium, thereby creating $TiO_2$ 26. A 1000A layer of platinum is then deposited on $TiO_2$ layer 26 by evaporation. The platinum is annealed at 650° C. for 1 hour. The annealing step promotes adhesion between the metal oxide and the platinum. The platinum layer is then masked and etched with aqua regia to form bottom electrode 28.

The ferroelectric material is then deposited and etched using conventional processes for form layer 30. In the preferred embodiment of the present invention, the ferroelectric material is PZT or PLZT. However, it will be apparent to those skilled in the art that other ferroelectric materials may be utilized.

The top electrode is preferably constructed using a conventional "lift-off" process. A layer of photoresist is deposited and developed for form the mask. A 1000A layer of platinum is then deposited on the lift-off pattern. The photoresist is then removed leaving the top electrode in place. Finally, a glass layer 34 is deposited over the capacitor and vias 20 and 22 opened to allow connections to the top and bottom electrodes.

While the above-described embodiments of the present invention generate the metallic oxide glue layer by first depositing a layer of metal and then oxidizing that layer, it will be apparent to those skilled in the art that the glue layer may be deposited in the form of an oxide. The method used in the preferred embodiment of the present invention, however, is to deposit the metal and then oxidize the metal. This method is preferred because it is difficult to etch the oxide layer. The present invention provides the ability to etch the glue layer material prior to oxidation.

While the above-described embodiments of the present invention utilize $TiO_2$ as the glue layer, it will be apparent to those skilled in the art that other metallic oxides may be utilized. In addition, it will be apparent that the metal oxide layer may be deposited on a silicon nitride layer in place of the $SiO_2$ layer described above. Various other modifications to the present invention will become apparent to those skilled in the art from the foregoing description and accompanying drawings. Accordingly, the present invention is to be limited solely by the scope of the following claims.

What is claimed is:

1. A method for constructing a ferroelectric capacitor on a silicon based substrate, said ferroelectric capacitor comprising a layer of ferroelectric material sandwiched between first and second electrodes, said first electrode being the closest electrode to said silicon based substrate, said method comprising the steps of:

(a) depositing a metallic layer;

(b) oxidizing said metallic layer;

(c) depositing a first platinum layer;

(d) annealing said first platinum layer;

(e) patterning said first platinum layer to form said first electrode;

(f) depositing a layer of said ferroelectric material; and (g) depositing and patterning a layer of platinum to form said second electrode.

2. The method of claim 1 wherein said metallic layer comprises titanium.

3. The method of claim 1 wherein said step of depositing and patterning said platinum layer to form said second electrode comprises the steps of:

(h) depositing and developing a photoresist lift-off pattern;

(i) depositing a platinum layer on said lift-off pattern; and (j) removing said photoresist pattern.

4. The method of claim 1 wherein said first platinum layer is less than 1000 angstroms.

* * * * *